United States Patent
Kavousian

(10) Patent No.: US 10,218,363 B1
(45) Date of Patent: Feb. 26, 2019

(54) BACKGROUND CALIBRATION FOR REAL-TIME CLOCK SYSTEMS

(71) Applicant: Verily Life Sciences LLC, Mountain View, CA (US)

(72) Inventor: Amirpouya Kavousian, San Jose, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 0 days.

(21) Appl. No.: 16/039,872

(22) Filed: Jul. 19, 2018

Related U.S. Application Data

(60) Provisional application No. 62/534,400, filed on Jul. 19, 2017.

(51) Int. Cl.
| | |
|---|---|
| *H03L 7/06* | (2006.01) |
| *H03L 7/08* | (2006.01) |
| *G06F 1/14* | (2006.01) |
| *H03L 7/07* | (2006.01) |

(52) U.S. Cl.
CPC .............. *H03L 7/0802* (2013.01); *G06F 1/14* (2013.01); *H03L 7/07* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 8,943,352 B1* | 1/2015 | Warneke | ............... | G06F 1/3234 713/500 |
| 2006/0176040 A1* | 8/2006 | Kernahan | ............. | G06F 1/3203 323/299 |
| 2009/0168849 A1* | 7/2009 | Rouxel | .................. | H04B 1/707 375/140 |
| 2009/0168939 A1* | 7/2009 | Constantinidis | .... | H04W 52/028 375/359 |
| 2011/0193640 A1* | 8/2011 | Oishi | ........................ | H03L 1/00 331/1 A |
| 2012/0242392 A1* | 9/2012 | Kim | .................... | H03K 19/0016 327/378 |
| 2013/0003626 A1* | 1/2013 | Husted | .............. | H04W 52/0293 370/311 |
| 2013/0272455 A1* | 10/2013 | HomChaudhuri | .. | H04L 27/2647 375/340 |
| 2015/0180486 A1* | 6/2015 | Shanan | .................... | H03L 7/099 327/156 |
| 2015/0222469 A1* | 8/2015 | Onishi | ...................... | H04B 1/10 375/376 |
| 2015/0236673 A1* | 8/2015 | Malpass | ................. | H03K 3/011 327/513 |
| 2015/0256186 A1* | 9/2015 | Matsubara | ................ | H03L 7/08 327/158 |

(Continued)

*Primary Examiner* — Adam Houston
(74) *Attorney, Agent, or Firm* — Perkins Coie LLP

(57) ABSTRACT

A circuit includes a reference clock terminal configured to receive a signal indicative of a reference clock, multiple low power oscillators (LPOs) and a controller. Each LPO is operable in at least one of three states including a sleep state in which the LPO is powered off, a calibration state in which the LPO undergoes calibration and an active mode in which the LPO is configured to provide a real-time clock based on the reference clock. The controller controls operation of the LPOs such that at most a single LPO is in the active state at any given time.

20 Claims, 6 Drawing Sheets

(56) References Cited

U.S. PATENT DOCUMENTS

| | | | | |
|---|---|---|---|---|
| 2015/0263741 A1* | 9/2015 | Li | .............. | H03B 1/00 |
| | | | | 327/156 |
| 2015/0318858 A1* | 11/2015 | Yang | .............. | H03L 1/027 |
| | | | | 327/156 |
| 2015/0364953 A1* | 12/2015 | Rippon | .............. | H02J 13/0013 |
| | | | | 327/156 |
| 2016/0036453 A1* | 2/2016 | Frank | .............. | H03L 7/099 |
| | | | | 327/156 |
| 2016/0056829 A1* | 2/2016 | Glibbery | .............. | H03M 1/123 |
| | | | | 341/155 |
| 2017/0155394 A1* | 6/2017 | Calhoun | .............. | G06F 1/04 |
| 2017/0170835 A1* | 6/2017 | Tsubota | .............. | H03B 5/32 |
| 2017/0205533 A1* | 7/2017 | Li | .............. | G01V 11/002 |
| 2018/0054162 A1* | 2/2018 | Pflum | .............. | G01R 19/00 |
| 2018/0091180 A1* | 3/2018 | Kushnir | .............. | H04B 17/11 |

\* cited by examiner

BACKGROUND CALIBRATION FOR REAL-TIME CLOCK SYSTEMS

PRIORITY CLAIM

The present document claims priority from U.S. Provisional Patent Application No. 62/534,400, filed Jul. 19, 2017, which application is incorporated by reference herein in their entirety.

TECHNICAL FIELD

Various embodiments concern techniques for performing calibration of timing circuits in a background mode.

BACKGROUND

Real-time clocks are used in many electronic systems to provide timing. Clock circuits are often continuously running and therefore could consume a significant portion of power budget in low power systems. At the same time, some applications may specify that real-time clock be accurate to within a tolerance and may have a jitter less than a target jitter value.

SUMMARY

The present document discloses techniques that can be used by implementations of methods and circuits for calibration of real-time calibration systems.

In one example aspect, a circuit is disclosed. The circuit includes a reference clock terminal configured to receive a signal indicative of a reference clock, a plurality of low power oscillators (LPOs), wherein each given LPO is operable in one of three states including: a sleep state in which the given LPO is powered off, a calibration state in which the given LPO undergoes calibration, and an active state in which the given LPO is configured to provide a real-time clock based on the reference clock, and a controller coupled to the plurality of LPOs to control operations of the LPOs such that, at any time, at most a single LPO is in the active state.

In another example aspect, a method for generating a real-time clock is disclosed. The method includes detecting a trigger event, controlling, in response to the trigger event, operation of a plurality of low power oscillators (LPOs) by generating state signals respectively to the LPOs, wherein the state signals cause each of the LPOs to operate in one of at least three states, including a sleep state in which an LPO is powered off, a calibration state in which the LPO is calibrated for frequency accuracy, and an active state in which the LPO is to provide a real-time clock based on the reference clock, and providing the state signals respectively to the LPOs to cause at most one LPO to be in the active state at a time.

In yet another aspect, a computer-readable program medium is disclosed. Code stored on the computer-readable program medium causes a processor to implement a method of generating a real-time clock. The code includes code for detecting a trigger event, code for controlling, in response to the trigger event, operation of a plurality of low power oscillators (LPOs) by generating state signals respectively to the LPOs, wherein the state signals cause each of the LPOs to operate in one of at least three states, including a sleep state in which an LPO is powered off, a calibration state in which the LPO is calibrated for frequency accuracy, and an active state in which the LPO is to provide a real-time clock based on the reference clock, and code for providing the state signals respectively to the LPOs to cause at most one LPO to be in the active state at a time.

These, and other embodiments and features, are described in greater details throughout the present document.

BRIEF DESCRIPTION OF THE DRAWINGS

Various features and characteristics of the technology will become more apparent to those skilled in the art from a study of the Detailed Description in conjunction with the drawings. Embodiments of the technology are illustrated by way of example and not limitation in the drawings, in which like references indicate similar elements.

Figure 1:
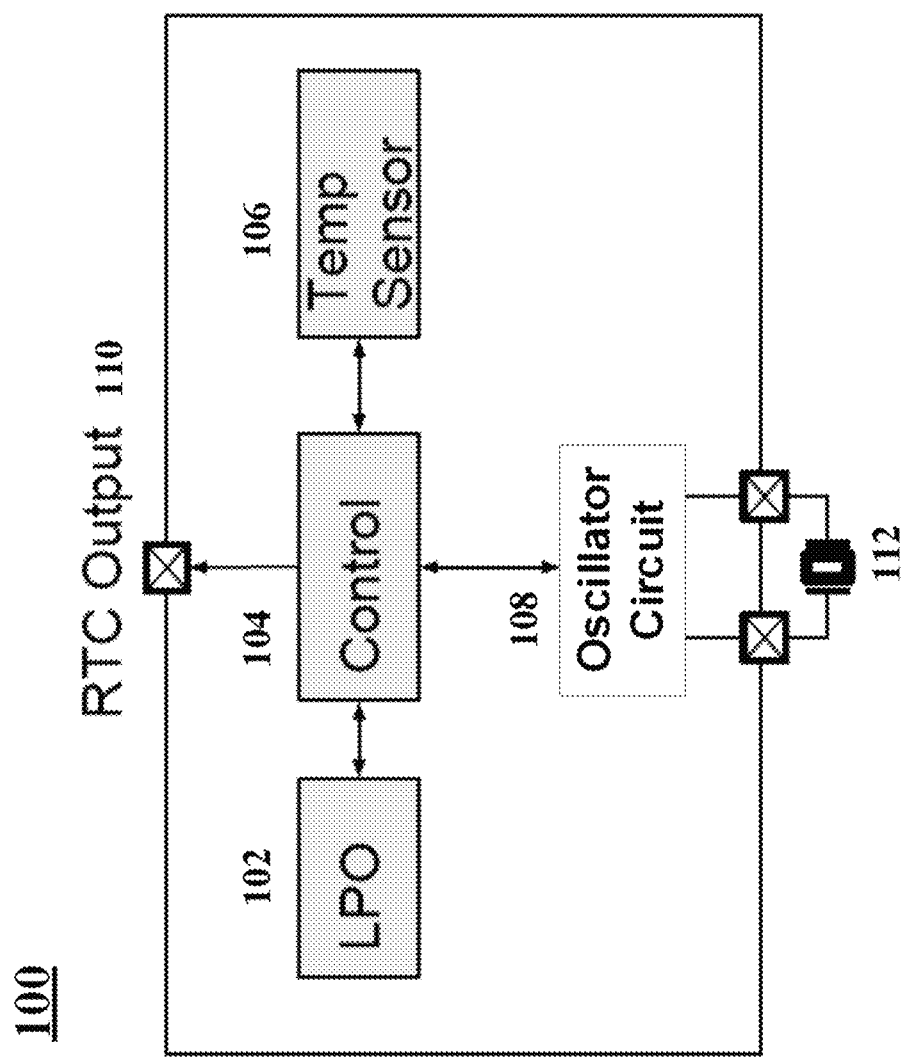
FIG. 1 depicts an example of a real-time clock generation system.

The drawings depict various embodiments for the purpose of illustration only. Those skilled in the art will recognize that alternative embodiments may be employed without departing from the principles of the technology. Accordingly, while specific embodiments are shown in the drawings, the technology is amenable to various modifications.

DETAILED DESCRIPTION

Real-time clocks (RTC) are used to provide timing in many electronic systems. The clock may be used to drive communication signal processing, signal reception and transmission, digital logic, and so on.

In many applications, when an electronic circuit is operating, so is the real-time clock. In other words, clock circuitry may be consuming power practically at all times during operation. Therefore, the power consumed by the RTC could become a significant portion of the total power budget for an electronic system. It is therefore beneficial to minimize the power consumed by RTC circuitry, especially in low power operations where the total power consumed by an electronic system is desired to be kept low due to regulatory or other requirements.

Practical applications of electronics systems that use RTC often also have tolerance specifications for clock accuracy and clock jitter. For example, some applications may specify clocks to have a less than 50 parts per million (ppm). The frequency error of an oscillator can be expressed as a numerical value of ppm, which indicates the delta (difference) between the actual frequency and the theoretical or ideal frequency, divided by the theoretical frequency value, multiplied by a million. Conventional onchip low power oscillators (LPOs) cannot typically provide the timing accuracy that many systems require.

Conventional approach to overcome this limitation of onchip oscillators is to use low frequency offchip crystals, and then use onchip circuitry that derives clock information from the offchip source. Such an implementation, however, typically adds to the bill of material (BOM) and the board area.

The techniques described in the present document can be used to implement electronic circuits that provide high accuracy onchip RTC circuitry that, at the same time, improves power consumption performance.

FIG. 1 depicts an example of a real-time clock system 100 in which an onchip oscillator is periodically calibrated using an accurate high frequency clock. In the system 100, a low power oscillator (LPO) 102 is coupled to, and operates under the control of, a controller 104. A temperature sensor 106 is also coupled to the controller 104 and provides signals indicative of ambient temperature of the system 100. The controller 104 is further coupled to an oscillator circuit 108 that is coupled to a reference oscillator 112. That may be external to the chip. The reference oscillator 112 may, for example, be a Film Bulk Acoustic Resonator (FBAR) type oscillator. The system 100 produces a real-time clock signal at the output 110, under control of the controller 104.

During operation, the controller 104 may use the temperature sensor 106 signal, or some other run-time criterion, to calibrate the LPO 102 using the clock signal from the reference oscillator 112. During operation, the LPO 102 and the relevant circuitry is always powered on, and therefore consuming power.

The system 100 may provide a reasonably accurate clock suitable for some application. However, there are applications that may desire improved short-term jitter performance that cannot be met by the system 100. In some cases, the main source of jitter in this system is the jitter acquired during calibration. Each RTC cycle may contain only one slow/fast cycle of the LPO, meaning that implementations may only have one cycle of slow/fast LPO cycle available for calibration. Because the jitter trades inversely to the number of cycles used in calibration, some embodiments may use a technique that provides calibration over multiple cycles.

Figure 2:
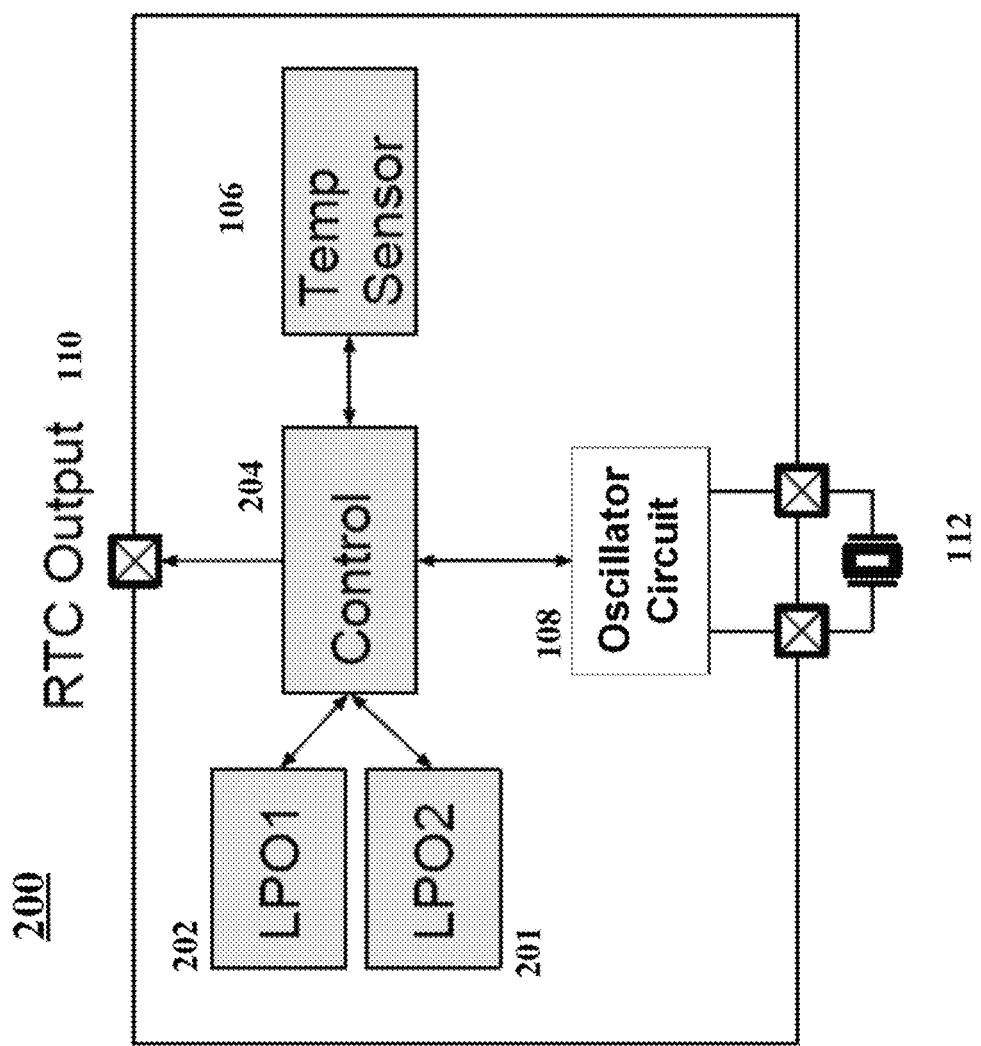
FIG. 2 depicts another example of a real-time clock generation system.

FIG. 2 depicts another example of a real-time clock system 200 in which multiple LPOs 201, 202 are used to produce the RTC output 110. In some implementations, the real-time clock system 200 may be implemented onchip. The reference oscillator 112 is depicted as being off-chip, but may also be implemented onchip.

In this system, two nominally identical LPO's work in tandem so that calibration can be run over multiple periods of LPO. This is possible because we calibrate the LPO that is in the background (or offline and not being used to directly drive the timing of operation). At each temperature change signal, the LPO that is in the background is turned on, calibrated and then swapped in and the other LPO is then turned off to save power. Since the calibration is run over the LPO that is in the background, there is no limitation on the number of LPO cycles used for calibration and the calibration can be run over extended number of LPO cycles.

While, for the sake of simplicity of explanation, the system 200 is depicted to have two LPO modules, in practice greater than two LPO modules may also be used. Such an arrangement of greater than two LPOs may be used to provide backup LPOs or to reduce the duty cycle of LPO calibration.

Figure 3:
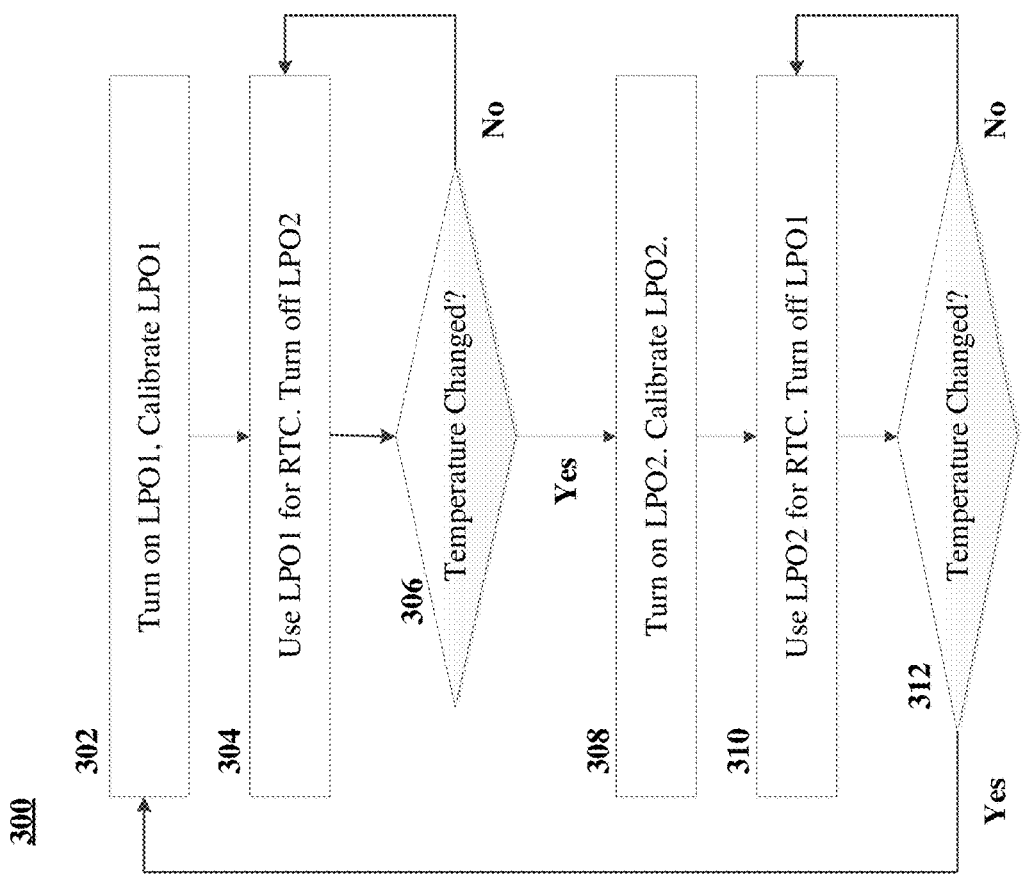
FIG. 3 depicts a flow chart of an example method of controlling operation of multiple low-power oscillators.

FIG. 3 depicts an example flowchart for a method 300 of generating and using a real-time clock in an electronic system. The method 300 may be implemented using the system 200 depicted in FIG. 2. For example, the system 200 or the controller 204 may implement the method 300.

At 302, LPO1 is turned on by the system 200. After turning on, the system 200 may perform calibration of LPO1. During this time, the system 200 may be using LPO2 for clock generation. After calibration of LPO1, the system 200 may use LPO1 for RTC generation and LPO2 may be turned off. During the operation of the system 200 with LPO1 being the RTC source, the system 200 may check, at 306, for whether temperature has changed by an amount that warrants LPO recalibration. When the system 200 decides to perform calibration, LPO2 may be turned on at 308 and calibration may be performed for LPO2. Upon completion of the calibration in step 308, the system 200 may use LPO2 for RTC clock generation at 310, and LPO1 may be turned off. If, on the other hand, at 306, the system 200 decides not to perform calibration, then system 200 may control the use of LPO1, while LPO2 stays off.

During the operation of LPO2 in step 310, the controller 204 may continue to monitor whether LPO2 may need re-calibration due to changes such as a temperature change indicated by a temperature sensor. At 312, when the determination is that no change is needed, the controller 204 may continue using LPO2 for RTC, with LPO1 being turned off. At 312, when the controller 204 decided that the RTC is to be re-calibrated, the controller 204 may go to step 302, as described above.

In some embodiments, a circuit comprises a reference clock terminal configured to receive a signal indicative of a reference clock or the reference clock signal, a plurality of LPOs and a controller. Each given LPO in the plurality is operable in three states. In the sleep state, the LPO is powered off. In the Calibration state, the LPO undergoes calibration. In the active state, the LPO is configured to provide the RTC based on the reference clock. The controller coupled to the plurality of LPOs to control the operation of the LPOs such that, at any given time, at most a single LPO may be in the active state. With multiple LPOs, the duty cycle of on-time of each LPO may be reduced proportional to the number of LPOs.

In the calibration state, the LPO may be calibrated using the reference clock. In some embodiments, the calibration may be achieved by comparing the number of pulses from the reference clock and comparing with the number of pulses generated by the LPO and using a feedback mechanism to speed up or slow down the LPO. In some embodiments, the calibration mechanism may be based on a phase locked loop. In some embodiments a numerical feedback filter may be used. In some embodiments, the controller may control the adjustment of a frequency signal output of the LPO. For example, the frequency signal output of the LPO may be a clock signal whose voltage varies with time at the clock frequency between zero volts and a nominal peak value. Alternatively, the frequency signal output might comprise a signal that varies between +A and −A (where A represents a peak amplitude) values at the output.

In the sleep state, the LPO power may be turned off. The LPO may thus consume no power in sleep state.

In the active state, power may be supplied to the LPO such that the LPO produces a clock signal. The output of the LPO may be used to produce and supply real-time clock to an electronic system. In some embodiments, the power consumed by the LPO in each state may be different. For example, the most power may be consumed in the active state, followed by the calibration state, followed by the sleep state in which zero or negligible (e.g., less than 1% of the active state) power may be consumed. Alternatively, in some embodiments, the LPO may consume same or similar power in the active and calibration states, and zero or almost zero power in the sleep state.

In some embodiments, exactly two LPOs may be used. During operation, one LPO may be used as a source of clock, while the other LPO may be in the sleep state or may be in the calibration state. In some embodiments, the circuit may also include a temperature sensor (e.g., temperature sensor 106) coupled to the controller. The temperature sensor is configured to generate a signal indicative of an ambient temperature of the circuit. In some embodiments, the controller is configured to control states of the plurality of LPOs based on the signal indicative of the ambient temperature. Alternatively and additionally, other operational conditions, such as passage of a specific time period, may be used by the controller to changes states of the LPOs.

In some embodiments, for example as depicted in FIG. 2, the circuit may be implemented as a single integrated chip and the reference clock may be derived from an off-chip reference source. The off-chip reference source may include an FBAR, as described in this document.

Figure 4:
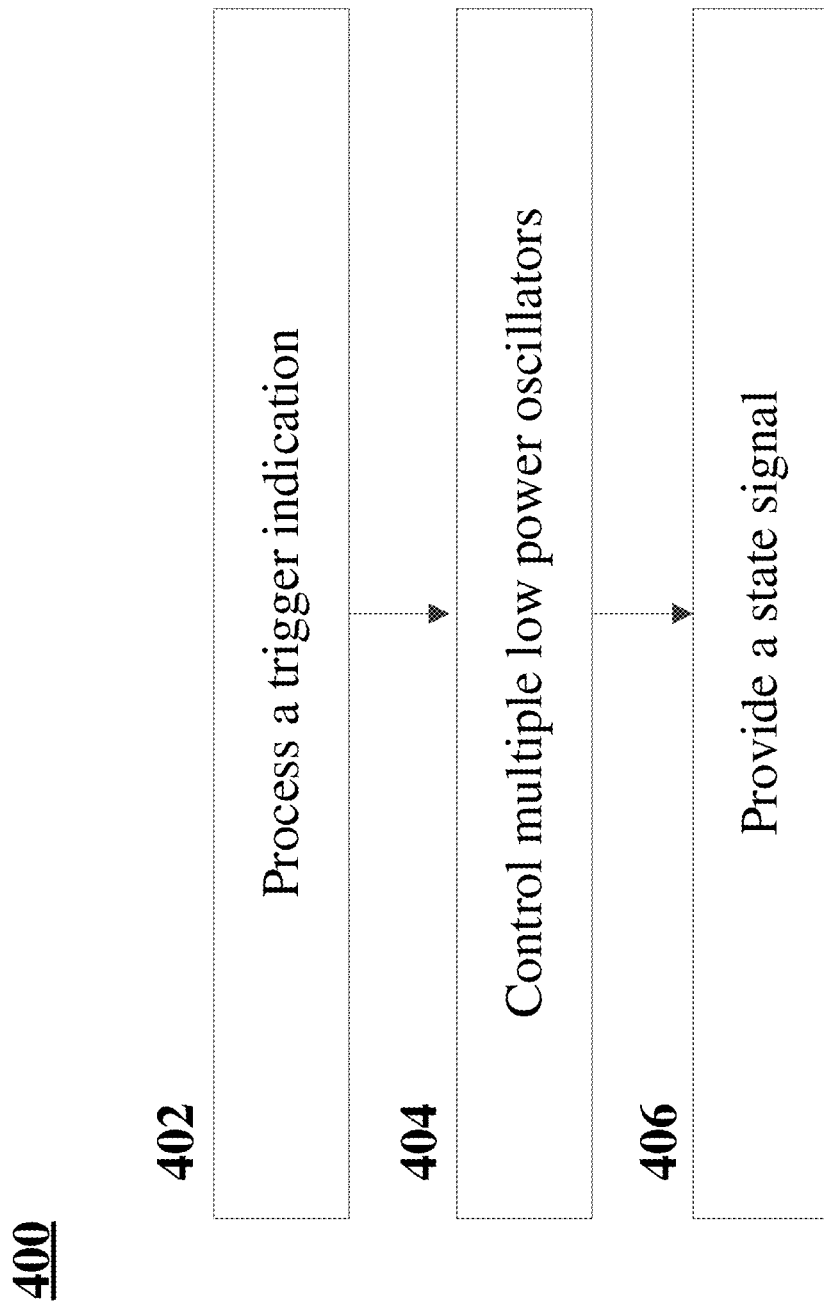
FIG. 4 depicts a flow diagram of a process for real-time clock generation.

FIG. 4 depicts a flowchart of an example method 400 for operating an electronic circuit. The method 400 includes, at 402, detecting a trigger event. The trigger event may be related to a decision about whether an LPO that is currently being used for RTC is to be calibrated due to the occurrence of a trigger event. The trigger event may be, for example, receiving a temperature signal from a temperature sensor. The temperature signal may reveal that ambient temperature of the system has sufficiently changed to recalibrate clock to meet a target performance requirement (e.g., to limit clock drift or clock jitter).

The method 400 includes, at 404, controlling, in response to the trigger event, operation of a plurality of low power oscillators (LPOs) by generating state signals respectively to the LPOs, wherein the state signals cause each of the LPOs to operate in one of at least three states, including a sleep state in which an LPO is powered off, a calibration state in which the LPO is calibrated for frequency accuracy, and an active state in which the LPO is to provide a real-time clock based on the reference clock.

The method 400 includes, at 406, providing the state signals such that at most one LPO to be in the active state. In some implementations, the state signal may be provided only to the LPOs whose state is to be changed (e.g., from active state to sleep state or from sleep state to calibration state). For example, in some cases, the states may be managed such that an LPO in active state can only transition to sleep state, and not calibration state. Similarly, in some cases, an LPO can only enter calibration state from sleep state, without first going through the active state. In some embodiments, the method 400 may further include calibrating an LPO operating in the calibration state using a reference clock. In some embodiments, the method 400 may operate upon exactly two LPOs. In some embodiments the operation of detecting the trigger event includes receiving ambient temperature information from a temperature sensor, and deciding, from the ambient temperature information, whether to initiate an LPO calibration. In some embodiments, the triggering event may be used to control the states of the plurality of LPOs, and transitioning from one state to another state for some of the plurality of LPOs. In some embodiments, the real-time clock is generated using an on-chip oscillator circuit which derives a reference clock from an off-chip reference source of timing signal such as using an FBAR.

Embodiments may also be described with reference to particular system configurations and networks. However, those skilled in the art will recognize that the features described herein are equally applicable to other system configurations, network types, etc. Moreover, the technology can be embodied as special-purpose hardware (e.g., circuitry), programmable circuitry appropriately programmed with software and/or firmware, or as a combination of special-purpose and programmable circuitry. Accordingly, embodiments may include a machine-readable medium having instructions that may be used to program a computing device to perform the methods described herein.

References in this description to "an embodiment" or "one embodiment" means that the particular feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the words "comprise" and "comprising" are to be construed in an inclusive sense rather than an exclusive or exhaustive sense (i.e., in the sense of "including but not limited to"). The terms "connected," "coupled," or any variant thereof is intended to include any connection or coupling, either direct or indirect, between two or more elements. The coupling/connection can be physical, logical, or a combination thereof. For example, two devices may be communicatively coupled to one another despite not sharing a physical connection.

When used in reference to a list of multiple items, the word "or" is intended to cover all of the following interpretations: any of the items in the list, all of the items in the list, and any combination of items in the list.

Unless contrary to physical possibility, it is envisioned that the steps described above may be performed in various sequences and combinations. For example, bringing on one LPO on line and turning off another LPO may be performed in succession or simultaneously.

Other steps may also be included in some embodiments. For example, decisions regarding when to change states of LPOs due to operational condition changes such as temperature may also use other operational condition changes such as passage of time or other suitable measurements of circuit operations.

In some embodiments, the above described methods may be embodied in the form of processor-executable code and stored on a computer-readable program medium. The code may include, for example, code for detecting a trigger event. The code may, for example, read an interrupt register to figure out the nature of the trigger event.

The code may further include code for controlling, in response to the trigger event, operation of a plurality of low power oscillators (LPOs) by generating state signals respectively to the LPOs, wherein the state signals cause each of the LPOs to operate in one of at least three states, including a sleep state in which an LPO is powered off, a calibration state in which the LPO is calibrated for frequency accuracy, and an active state in which the LPO is to provide a real-time clock based on the reference clock.

The code may further include code for providing the state signals respectively to the LPOs to cause at most one LPO to be in the active state at a time. Other techniques codified in the code are further described with respect to FIGS. 3 and 4.

Processing Systems

Figure 5:
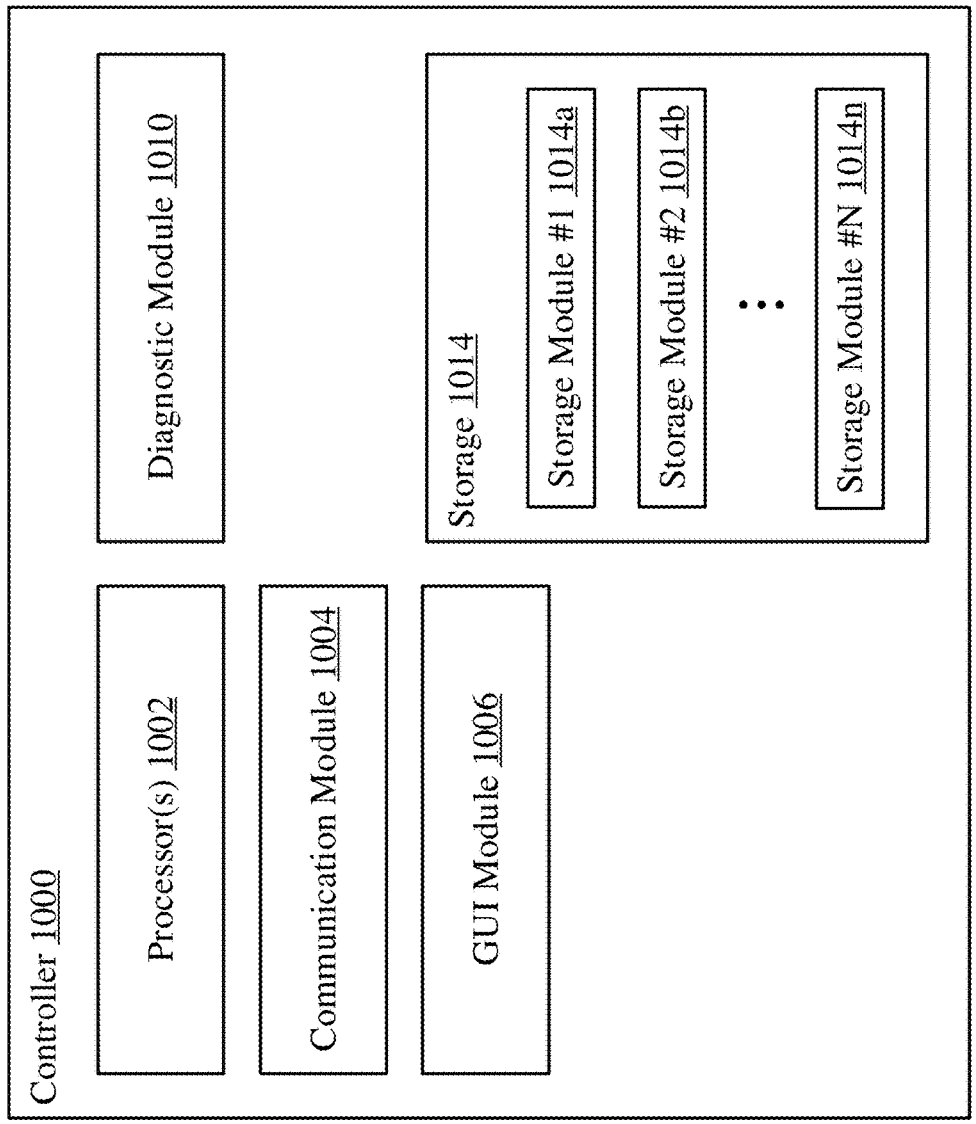
FIG. 5 is a block diagram of a controller in a real-time clock electronic system.

FIG. 5 is a block diagram of a controller 1000 configured to perform the RTC generation described herein. In some aspects, the controller 1000 may be similar to the controller 204 described herein. The controller 1000 can include one or more processors 1002, a communication module 1004, a graphical user interface (GUI) module 1006, a diagnostic module 1010, and storage 1014. Other embodiments of the controller 1000 may include some or all of these modules and components, along with other modules and/or components.

The processor(s) 1002 can execute the modules from instructions stored in storage 1014, which can be any device or mechanism capable of storing information. Communication module 1004 may manage communication between components of the analytics platform 1000 and/or between the analytics platform 1000 and other functional modules in an electronic system. For example, the communication module 1004 may receive temperature data via a data bus from a temperature sensor. As another example, the communication module 1004 may transmit a signal that controls states of the LPOs. The movement data received by the communication module 1004 can be stored in storage 1014, one or more particular storage modules (e.g., storage modules 1014*a-n*).

The GUI module 1006 can generate data or information that is presentable to a human on an interface. The interface may be presented by a web browser, desktop software program, mobile application, or over-the-top (OTT) application. Accordingly, the interface may be accessible via a mobile phone, tablet computer, personal computer, game console (e.g., Sony PlayStation® or Microsoft Xbox®), wearable electronic device (e.g., a watch or fitness tracker), network-connected ("smart") devices, virtual/augmented reality systems (e.g., Oculus Rift® or Microsoft Hololens®), etc.

Figure 6:
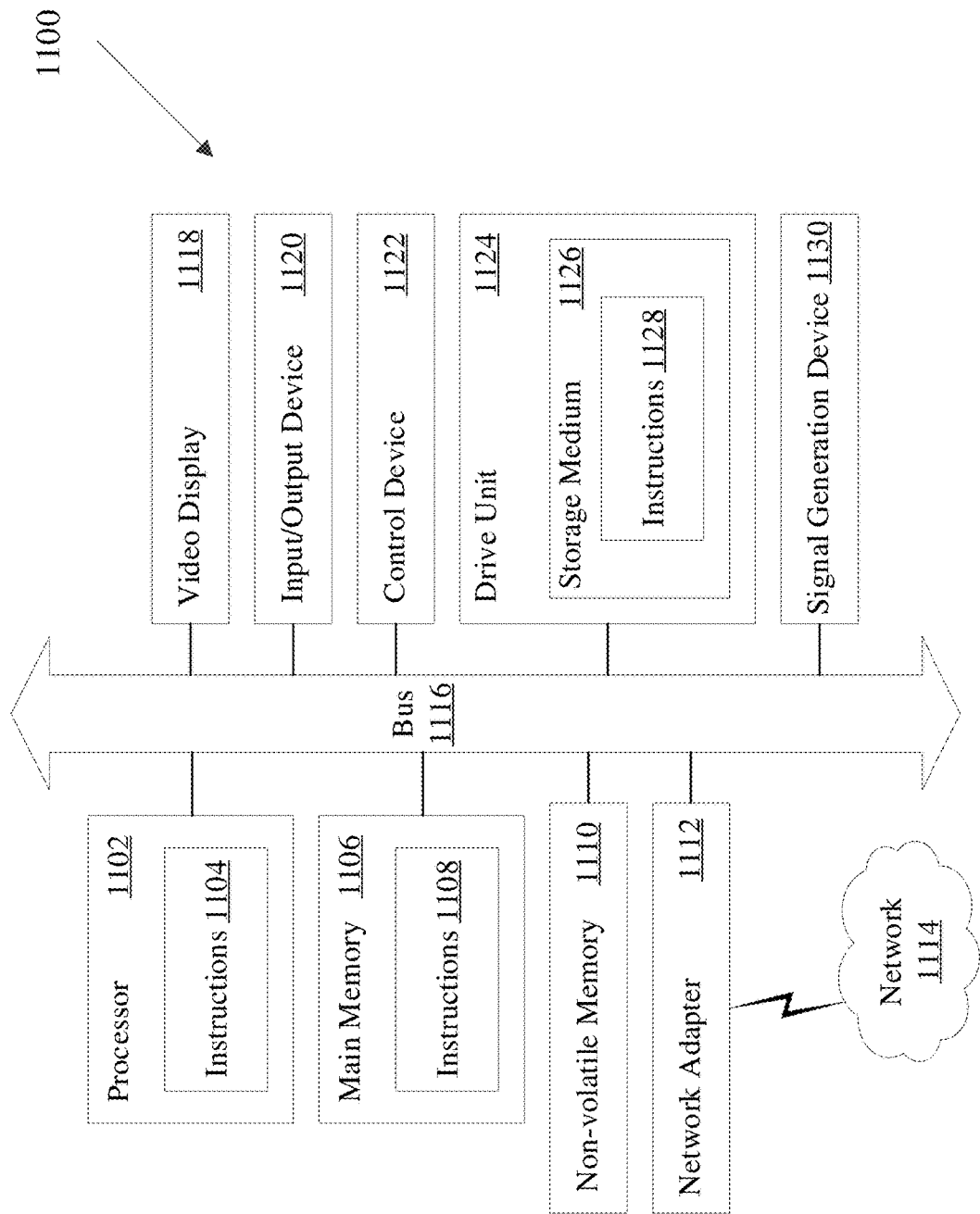
FIG. 6 is a block diagram illustrating an example of a processing system in which at least some operations described herein can be implemented.

FIG. 6 is a block diagram illustrating an example of a processing system 1100 in which at least some operations described herein can be implemented. For example, the real-time clock and the circuit described herein may be used to drive the operation of the processing system 1100.

The processing system 1100 may include one or more central processing units ("processors") 1102, main memory 1106, non-volatile memory 1110, network adapter 1112 (e.g., network interfaces), video display 1118, input/output devices 1120, control device 1122 (e.g., keyboard and pointing devices), drive unit 1124 including a storage medium 1126, and signal generation device 1130 that are communicatively connected to a bus 1116. The bus 1116 is illustrated as an abstraction that represents one or more physical buses and/or point-to-point connections that are connected by appropriate bridges, adapters, or controllers. The bus 1116, therefore, can include a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus (also referred to as "Firewire").

The processing system 1100 may be a server, a personal computer, a tablet computer, a personal digital assistant (PDA), a mobile phone, a gaming console, a gaming device, a music player, a wearable electronic device, a network-connected ("smart") device, a virtual/augmented reality system, or any other machine capable of executing a set of instructions (sequential or otherwise) that specify actions to be taken by the processing system 1100.

While the main memory 1106, non-volatile memory 1110, and storage medium 1126 (also called a "machine-readable medium") are shown to be a single medium, the term "machine-readable medium" and "storage medium" should be taken to include a single medium or multiple media (e.g., a centralized or distributed database, and/or associated caches and servers) that store one or more sets of instructions 1128. The term "machine-readable medium" and "storage medium" shall also be taken to include any medium that is capable of storing, encoding, or carrying a set of instructions for execution by the processing system 1100.

In general, the routines executed to implement the embodiments of the disclosure may be implemented as part of an operating system or a specific application, component, program, object, module, or sequence of instructions (collectively referred to as "computer programs"). The computer programs typically comprise one or more instructions (e.g., instructions 1104, 1108, 1128) set at various times in various memory and storage devices in a computing device. When read and executed by the one or more processors 1102, the instruction(s) cause the processing system 1100 to perform operations to execute elements involving the various aspects of the disclosure.

It will be appreciated that this patent document discloses techniques that may be embodied in a real time clock system in which an onchip oscillator is periodically calibrated using an accurate high frequency clock. For example, the real time clock system may be implemented in an onchip Bluetooth low energy (BLE) implementation that may be a part of a medical or a diagnostic communication device.

It will further be appreciated that the disclosed techniques can be used to implement embodiments in which onchip LPOs can use several cycles of time for calibration, thereby improving accuracy of clock over schemes where calibration is performed over a short number of cycles, e.g., one or two cycles. In some embodiments, multiple LPOs may be implemented onchip, such that only one LPO is actively producing the system clock, while other LPOs may either be powered off, or being calibrated in an offline mode in which their output is not used to drive the system's real time clock.

Moreover, while embodiments have been described in the context of fully functioning electronic devices, those skilled in the art will appreciate that the various embodiments are capable of being distributed as a program product in a variety of forms. The disclosure applies regardless of the particular type of machine or computer-readable media used to actually effect the distribution.

Further examples of machine-readable storage media, machine-readable media, or computer-readable media include recordable-type media such as volatile and non-volatile memory devices 1110, floppy and other removable disks, hard disk drives, optical disks (e.g., Compact Disk Read-Only Memory (CD ROMS), Digital Versatile Disks (DVDs)), and transmission-type media such as digital and analog communication links.

The network adapter 1112 enables the processing system 1100 to mediate data in a network 1114 with an entity that is external to the processing system 1100 through any communication protocol supported by the processing system 1100 and the external entity. The network adapter 1112 can include one or more of a network adaptor card, a wireless network interface card, a router, an access point, a wireless router, a switch, a multilayer switch, a protocol converter, a gateway, a bridge, bridge router, a hub, a digital media receiver, and/or a repeater.

The network adapter 1112 may include a firewall that governs and/or manages permission to access/proxy data in a computer network, and tracks varying levels of trust between different machines and/or applications. The firewall can be any number of modules having any combination of hardware and/or software components able to enforce a predetermined set of access rights between a particular set of machines and applications, machines and machines, and/or applications and applications (e.g., to regulate the flow of traffic and resource sharing between these entities). The firewall may additionally manage and/or have access to an access control list that details permissions including the access and operation rights of an object by an individual, a machine, and/or an application, and the circumstances under which the permission rights stand.

The techniques introduced here can be implemented by programmable circuitry (e.g., one or more microprocessors), software and/or firmware, special-purpose hardwired (i.e., non-programmable) circuitry, or a combination of such forms. Special-purpose circuitry can be in the form of one or more application-specific integrated circuits (ASICs), programmable logic devices (PLDs), field-programmable gate arrays (FPGAs), etc.

REMARKS

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

The invention claimed is:

1. A circuit, comprising:
 a reference clock terminal configured to receive a signal indicative of a reference clock;
 a plurality of low power oscillators (LPOs), wherein each given LPO is operable in one of three states including: a sleep state in which the given LPO is powered off, a calibration state in which the given LPO undergoes calibration, and an active state in which the given LPO is configured to provide a real-time clock based on the reference clock; and
 a controller coupled to the plurality of LPOs to control operations of the LPOs such that, at any time, at most a single LPO is in the active state.

2. The circuit of claim 1, wherein the controller is configured to adjust, based on the reference clock, a frequency signal output of the given LPO, when the given LPO is operating in the calibration state.

3. The circuit of claim 1, wherein the plurality of LPOs comprises exactly two LPOs.

4. The circuit of claim 1, further comprising a temperature sensor coupled to the controller wherein the temperature sensor is configured to generate a signal indicative of an ambient temperature of the circuit.

5. The circuit of claim 4, wherein the controller is configured to control states of the plurality of LPOs based on the signal indicative of the ambient temperature.

6. The circuit of claim 1, wherein the circuit is a single integrated circuit chip and wherein the reference clock is derived from an off-chip reference source.

7. The circuit of claim 6, further comprising an on-chip oscillator circuit, wherein the reference clock is coupled to the controller through an on-chip oscillator circuit.

8. The circuit of claim 6, wherein the off-chip reference source comprises a thin film bulk acoustic resonator.

9. A method of generating a real-time clock, comprising:
 detecting a trigger event;
 controlling, in response to the trigger event, operation of a plurality of low power oscillators (LPOs) by generating state signals respectively to the LPOs, wherein the state signals cause each of the LPOs to operate in one of at least three states, including a sleep state in which an LPO is powered off, a calibration state in which the LPO is calibrated for frequency accuracy, and an active state in which the LPO is to provide a real-time clock based on the reference clock; and
 providing the state signals respectively to the LPOs to cause at most one LPO to be in the active state at a time.

10. The method of claim 9, further including:
 calibrating an LPO operating in the calibration state using a reference clock.

11. The method of claim 9, wherein the plurality of LPOs comprises exactly two LPOs.

12. The method of claim 9, wherein the detecting the trigger event includes:
 receiving ambient temperature information from a temperature sensor; and
 deciding, from the ambient temperature information, whether to initiate an LPO calibration.

13. The method of claim 12, further comprising:
 controlling states of the plurality of LPOs based on the trigger event.

14. The method of claim 10, wherein the real time clock is generated on-chip and wherein the reference clock is derived from an off-chip reference source.

15. The method of claim 14, wherein the reference clock is coupled to the controller through an on-chip circuit.

16. The method of claim 15, wherein the off-chip reference source comprises a thin film bulk acoustic resonator.

17. A computer-readable program medium having code stored thereon, the code, when executed by a processor, causing the processor to implement a method of generating real time clock, the code comprising:
 code for detecting a trigger event;
 code for controlling, in response to the trigger event, operation of a plurality of low power oscillators (LPOs) by generating state signals respectively to the LPOs, wherein the state signals cause each of the LPOs to operate in one of at least three states, including a sleep state in which an LPO is powered off, a calibration state in which the LPO is calibrated for frequency accuracy, and an active state in which the LPO is to provide a real-time clock based on the reference clock; and code for providing the state signals respectively to the LPOs to cause at most one LPO to be in the active state at a time.

18. The computer-readable program medium of claim 17, wherein the code further includes:

code for calibrating an LPO operating in the calibration state using a reference clock.

19. The computer-readable program medium of claim 17, wherein the code for detecting the trigger event includes:

code for receiving ambient temperature information from a temperature sensor; and code for deciding, from the ambient temperature information, whether to initiate an LPO calibration.

20. The computer-readable program medium of claim 19, wherein the code further includes:

code for controlling states of the plurality of LPOs based on the trigger event.

\* \* \* \* \*